United States Patent
Nallan et al.

(10) Patent No.: US 6,855,643 B2
(45) Date of Patent: Feb. 15, 2005

(54) METHOD FOR FABRICATING A GATE STRUCTURE

(76) Inventors: Padmapani C. Nallan, 2200 Pettigrew Drive, San Jose, CA (US) 95148; Ajay Kumar, 510 Kenilworth Ct., Sunnyvale, CA (US) 94087

( * ) Notice: Subject to any disclaimer, the term of this patent is extended or adjusted under 35 U.S.C. 154(b) by 102 days.

(21) Appl. No.: 10/194,609

(22) Filed: Jul. 12, 2002

(65) Prior Publication Data

US 2004/0009634 A1 Jan. 15, 2004

(51) Int. Cl.[7] .................. H01L 21/31; H01L 21/469
(52) U.S. Cl. ........................... 438/775; 438/695
(58) Field of Search ............................ 438/695, 770, 438/775, 673, 908, 911, 734, 735, 745, 706, 787, 788, 785, 791, 792, 909, 647, 648, 649, 656, 657, 663, 683

(56) References Cited

U.S. PATENT DOCUMENTS

| | | | |
|---|---|---|---|
| 5,071,714 A | 12/1991 | Rodbell et al. | 428/620 |
| 5,110,408 A | * 5/1992 | Fujii et al. | 216/75 |
| 5,188,979 A | 2/1993 | Filipiak | 437/192 |
| 5,200,028 A | * 4/1993 | Tatsumi | 156/656 |
| 5,337,207 A | 8/1994 | Jones et al. | 361/321.1 |
| 5,356,833 A | 10/1994 | Maniar et al. | 437/187 |
| 5,391,244 A | * 2/1995 | Kadomura | 156/662 |
| 5,674,782 A | * 10/1997 | Lee et al. | 438/695 |
| 6,184,072 B1 | 2/2001 | Kaushik et al. | 438/197 |
| 6,204,141 B1 | 3/2001 | Lou | 438/386 |
| 6,270,568 B1 | 8/2001 | Droopad et al. | 117/4 |
| 6,297,095 B1 | 10/2001 | Muralidhar et al. | 438/257 |
| 6,300,202 B1 | 10/2001 | Hobbs et al. | 438/287 |
| 6,319,730 B1 | 11/2001 | Ramdani et al. | 438/3 |
| 6,323,143 B1 | * 11/2001 | Yu | 438/791 |
| 6,326,261 B1 | 12/2001 | Tsang et al. | 438/243 |
| 6,348,386 B1 | 2/2002 | Gilmer | 438/288 |

FOREIGN PATENT DOCUMENTS

| | | | |
|---|---|---|---|
| WO | 01/51072 | 7/2001 | A61K/38/00 |
| WO | 01/97257 | 12/2001 | |

OTHER PUBLICATIONS

Visokay, et al. "Application of HfSiON as a gate dielectric material," Applied Physics Letters, 8(17), 3183–3185, 2002.
Yee, et al., "Reactive radio frequency sputter deposition of higher nitrides of titanium, zirconium and hafnium," J. Vac. Sci. Technol A 4(3) May/Jun. 1986, 381–387.

* cited by examiner

Primary Examiner—David Nhu
(74) Attorney, Agent, or Firm—Moser, Patterson & Sheridan, L.L.P.; Joseph Bach

(57) ABSTRACT

A method for fabricating a gate structure having a polysilicon electrode using an oxygen-free chemistry to etch the polysilicon. In one embodiment, the chemistry further includes nitrogen.

51 Claims, 5 Drawing Sheets

| PROCESS OF THE PRESENT INVENTION UTILIZING A DPS CHAMBER | | | | | | | |
|---|---|---|---|---|---|---|---|
| | | SINGLE-STEP ETCH 702 | | | TWP-STEP ETCH 704 | | |
| PARAMETER | UNITS | MIN | MAX | PREFERRED | MIN | MAX | PREFERRED |
| HBr | SCCM | 20 | 300 | 40 | 20 | 200 | 40 |
| $Cl_2$ | SCCM | 2 | 200 | 40 | 20 | 100 | 40 |
| $N_2$ | SCCM | 0 | 100 | 20 | 0 | 100 | 20 |
| TOTAL PRESSURE | mTORR | 2 | 100 | 4 | 2 | 100 | 4 |
| ANTENNA POWER | WATT | 200 | 3000 | 1100 | 200 | 3000 | 1100 |
| PEDESTAL POWER | WATT | 0 | 300 | 20 | 0 | 300 | 20 |
| PEDESTAL TEMPERATURE | DEGREES CELSIUS | 100 | 500 | 350 | 100 | 500 | 350 |

FIG. 7

METHOD FOR FABRICATING A GATE STRUCTURE

BACKGROUND OF THE INVENTION

1. Field of the Invention

The present invention generally relates to a method for processing semiconductor substrates. More specifically, the invention relates to a method for fabricating a gate structure in a semiconductor substrate processing system.

2. Description of the Related Art

The evolution of integrated circuit designs continually requires faster circuitry, greater circuit densities and necessitates a reduction in the dimensions of the integrated circuit components and use of materials that improve electrical performance of such components. Field effect transistors that are used in forming an integrated circuit generally utilize polysilicon gate electrodes deposited upon a gate dielectric that separates the electrode from a channel between the source and drain regions of the transistor. In prior art, high speed transistor structures, the gate dielectric is typically fabricated of a very thin layer of silicon dioxide ($SiO_2$) and/or a very thin layer of one of materials having a high dielectric constant (high K) such as $HfO_2$, $Al_2O_3$, $ZrO_2$, barium strontium titanate (BST), lead zirconate titanate (PZT), $ZrSiO_2$, $HFSiO_2$, $HfSiON$, or $TaO_2$. Herein high K materials are the materials having a dielectric constant greater than 4.0. The polysilicon electrodes in these transistor structures are fabricated using a plasma etching in oxygen-containing chemistry, such as $HBr/Cl_2/CF_4/HeO_2$, $HBr/Cl_2/CF_4/O_2$ and the like. Oxygen in these chemistries is used to improve selectivity of the gate dielectric to silicon during the etch.

To form a transistor, regions in the substrate are doped to form source and drain regions. A high K dielectric such as hafnium dioxide is deposited over the substrate. Polysilicon is then deposited over the dielectric layer and the polysilicon is then annealed at a high temnperature. To define the gate electrode, a patterned hard mask layer (typically, $SiO_2$) is formed atop the polysilicon. The polysilicon is etched in a two-step process. The first step comprises a main etch wherein polysilicon is removed until some of the underlying dielectric layer is exposed. The second step comprises an overetch wherein the remaining polysilicon that is not protected by the mask is removed. The main etch uses an aggressive chemistry comprising HBr and $Cl_2$ as main etchant gas. The overetch uses a less aggressive chemistry comprising HBr, $Cl_2$, and $O_2$, where the $O_2$ enhances the selectivity of the etch to $SiO_2$.

SUMMARY OF THE INVENTION

It has been discovered that when the gate electrode is formed on a high K dielectric that is oxygen permeable such as hafnium-dioxide, the oxygen used in the overetch will penetrate the hafnium-dioxide and form $SiO_2$ at the surface of the substrate. This $SiO_2$ will penetrate into the drain and source regions making the transistors operate suboptimally or not at all. To mitigate the oxygen penetration, a method for plasma etching a polysilicon electrode of a gate structure in an oxygen-free etching chemistry is used. In one embodiment, the oxygen-free etching chemistry comprises nitrogen. Specifically, the invention is a method of fabricating a gate structure having a polysilicon electrode and an oxygen permeable dielectric layer deposited on a semiconductor substrate, the method etches a defined portion of the polysilicon layer in a plasma comprising an oxygen-free gas chemistry until all of the defined portion is removed.

BRIEF DESCRIPTION OF THE DRAWINGS

The teachings of the present invention can be readily understood by considering the following detailed description in conjunction with the accompanying drawings, in which:

FIG. 7 is a table summarizing the processing parameters of one embodiment of the inventive method when practiced using a DPS Centura® etch system.

To facilitate understanding, identical reference numerals have been used, where possible, to designate identical elements that are common to the figures.

Figure 1A:
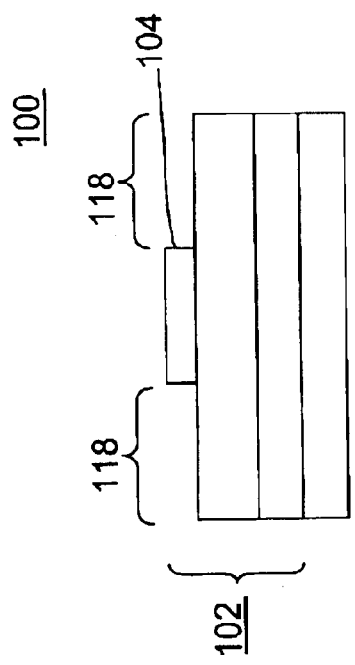
FIG. 1a depicts a schematic cross-sectional view of a wafer having a polysilicon layer and hafnium-dioxide layer of the kind used in performing the etching processes according to an example of the present invention.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method of plasma etching a polysilicon layer to form electrode of a gate structure using an oxygen-free etching chemistry. Such etching forms a gate electrode atop a high K dielectric layer that overlays a silicon substrate comprising a drain and source regions. In one embodiment, the oxygen-free etching chemistry comprises one or several chlorinated/brominated/fluorinated chemistries (e.g., comprising $Cl_2$, HBr, $CF_4$, and the like) and may comprise one or several optional inert gases (e.g., helium ($He_2$) and the like) The gate dielectric may be fabricated from a layer or layers of materials having a high dielectric constant (high K) such as $HfO_2$, $Al_2O_3$, $ZrO_2$, barium strontium titanate (BST), lead zirconate titanate (PZT), $ZrSiO_2$, $HfSiO_2$, $HfSiON$, $TaO_2$, and the like. The exact stoichiometry of these materials is not critical and may vary from the ratios given in the formulas. By using the oxygen-free chemistry, the inventive method prevents diffusion of oxygen ($O_2$) through the gate dielectric into the underlying silicon (Si). Such diffusion creates silicon dioxide ($SiO_2$) in the channel, source, and drain regions of the transistor. The method can be practiced as either a single-step etch process or a two-step etch process. The two-step etch process comprises the main etch and overetch steps. In a two-step etch process, most of polysilicon is removed, generally at a higher rate, during the main etch step, while the remaining traces of polysilicon are removed during the overetch step.

Further improvements are achieved in one embodiment of the present invention by using the oxygen-free chemistry in conjunction with nitrogen ($N_2$). The nitrogen or a mixture of nitrogen with an inert gas such as He may be added to the oxygen-free etching chemistry during either a single-step or two-step etch process. In the two-step etch process, nitrogen can be added to the oxygen-free chemistry during either a main etch or overetch step. Alternatively, after the polysilicon is removed, the wafer may be exposed to a nitrogen containing plasma, either in-situ or in a dedicated plasma reactor, to passivate exposed dielectric material.

During plasma processing, nitrogen passivates the oxygen permeable dielectric material by forming a thin nitride layer on the surface of dielectric. Such passivation blocks oxygen ($O_2$) from diffusing through the gate dielectric layer into the underlying silicon layer that comprises the channel, source, and drain regions of a transistor. In one illustrative embodiment, the hafnium-dioxide ($HfO_2$) is used as a gate dielectric and the etch process uses a $HBr/Cl_2$ etchant during the main etch step and a mixture of the $HBr/Cl_2$ etchant with $N_2$ during the overetch step. Hafnium-dioxide is a material having a natural selectivity to silicon of about 100:1 during plasma etching in the $HBr/Cl_2$ chemistry and it is compatible with use of the nitrogen passivation that prevents diffusion of oxygen through the $HfO_2$ layer into the underlying silicon. The nitrogen forms $HfO_2N$ on the surface of the dielectric to block oxygen penetration.

Plasma etching a polysilicon electrode process can be performed in a Decoupled Plasma Source (DPS) reactor of the Centura® metal etch system, available from Applied Materials, Inc. of Santa Clara, Calif. The DPS reactor uses a 2 MHz inductive plasma source to generate and sustain high density plasma. A wafer is biased by a 13.56 MHz bias source. The decoupled nature of the plasma source allows independent control of ion energy and ion density. The DPS reactor provides a wide process window over changes in source and bias power, pressure, and etch gas chemistry and uses an endpoint system to determine an end of the etch process.

Figure 6:
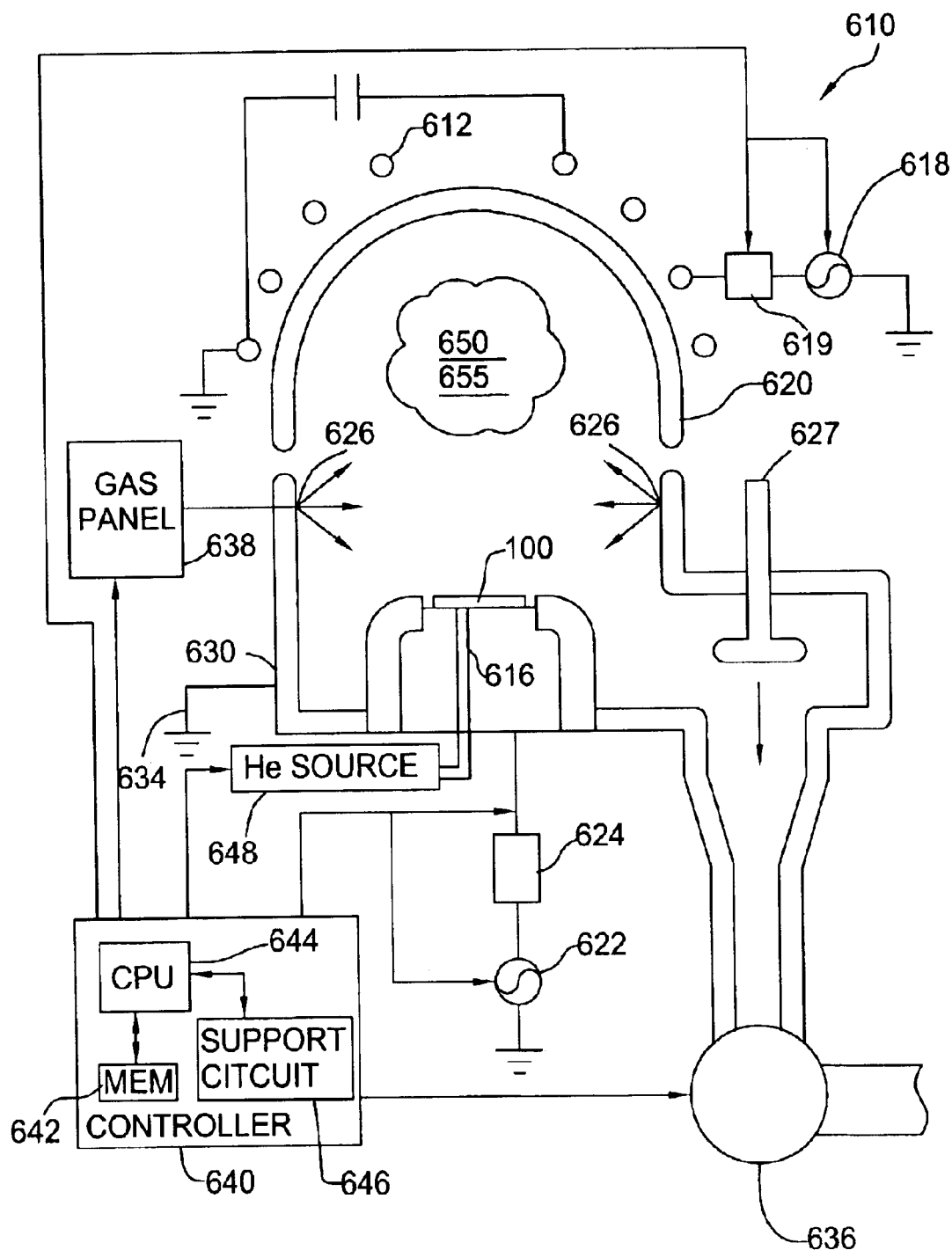
FIG. 6 depicts a schematic diagram of a plasma processing apparatus of the kind used in performing the etching and passivation processes according to one embodiment of the present invention.

FIG. 6 depicts a schematic diagram of the DPS etch process chamber 610, that comprises at least one inductive coil antenna segment 612, positioned exterior to a dielectric, dome-shaped ceiling 620 (referred to herein as the dome 620). Other chambers may have other types of ceilings, e.g., a flat ceiling. The antenna segment 612 is coupled to a radio-frequency (RF) source 618 (that is generally capable of producing an RF signal having a tunable frequency of about 50 kHz and 13.56 MHz. The RF source 618 is coupled to the antenna 612 through a matching network 619. Process chamber 610 also includes a substrate support pedestal (cathode) 616 that is coupled to a source 622 that is generally capable of producing an RF signal having a frequency of approximately 13.56 MHz. The source 622 is coupled to the cathode 616 through a matching network 624. Optionally, the source 622 may be a DC or pulsed DC source. The chamber 610 also contains a conductive chamber wall 630 that is connected to an electrical ground 634. A controller 640 comprising a central processing unit (CPU) 644, a memory 642, and support circuits 646 for the CPU 644 is coupled to the various components of the DPS etch process chamber 610 to facilitate control of the etch process.

In operation, a semiconductor wafer (herein also referred to as substrate) 100 is placed on the substrate support pedestal 616 and gaseous components are supplied from a gas panel 638 to the process chamber 610 through entry ports 626 to form a gaseous mixture 650. The gaseous mixture 650 is ignited into a plasma 655 in the process chamber 610 by applying RF power from the RF sources 618 and 622 respectively to the antenna 612 and the cathode 616. The pressure within the interior of the etch chamber 610 is controlled using a throttle valve 627 situated between the chamber 610 and a vacuum pump 636. The temperature at the surface of the chamber walls 630 is controlled using liquid-containing conduits (not shown) that are located in the walls 630 of the chamber 610.

The temperature of the substrate 100 is controlled by stabilizing the temperature of the support pedestal 616 and flowing helium gas from source 648 to channels formed by the back of the substrate 100 and grooves (not shown) on the pedestal surface. The helium gas is used to facilitate heat transfer between the pedestal 616 and the substrate 100. During the etch process, the substrate 100 is heated by a resistive heater within the pedestal to a steady state temperature and the helium facilitates uniform heating of the substrate 100. Using thermal control of both the dome 620 and the pedestal 616, the substrate 100 is maintained at a temperature of between 100 and 500 degrees Celsius.

The RF power applied to the inductive coil antenna 612 has a frequency between 50 kHz and 13.56 MHz and has a power of 200 to 2500 Watts. The bias power applied to the pedestal 616 may be in a form of DC, pulsed DC, or RF and is between 0 and 300 Watts.

To facilitate control of the chamber as described above, the CPU 644 may be one of any form of general purpose computer processor that can be used in an industrial setting for controlling various chambers and subprocessors. The memory 642 is coupled to the CPU 644. The memory 642, or computer-readable medium, may be one or more of readily available memory such as random access memory (RAM), read only memory (ROM), floppy disk, hard disk, or any other form of digital storage, local or remote. The support circuits 646 are coupled to the CPU 644 for supporting the processor in a conventional manner. These circuits include cache, power supplies, clock circuits, input/output circuitry and subsystems, and the like. An etching process is generally stored in the memory 642 as a software routine. The software routines may also be stored and/or executed by a second CPU (not shown) that is remotely located from the hardware being controlled by the CPU 644.

The software routines are executed after the wafer 100 is positioned on the pedestal 616. The software routines, when executed by the CPU 644, transform the general purpose computer into a specific purpose computer (controller) 640 that controls the chamber operation such that the etching processes are performed. Although the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Those skilled in the art will understand that other forms of etch chambers may be used to practice the invention, including chambers with remote plasma sources, microwave plasma chambers, electron cyclotron resonance (ECR) plasma chambers, and the like.

FIG. 1a is a schematic cross-sectional view of a wafer having, for example, a polysilicon layer and a hafnium-dioxide layer of the kind used in performing the etching processes according to an example of the present invention. In this example, the wafer 100 comprises a film stack 102. The film stack 102 comprises layers 104, 106, and 108. The polysilicon layer 106 and hafnium-dioxide layer 108 are formed above a doped silicon substrate 110. The layers 106 and 108 have a thickness, for example, of about 5000 and 50 Angstrom, respectively. The layer 104 is formed from a dielectric material such as $SiO_2$. The layer 104 typically has a thickness of about 5000 Angstrom and is conventionally processed using a lithographic routine, i.e., the dielectric material is applied to a surface of the wafer and patterned to form a hard mask. The hard mask is generally a $SiO_2$ layer that remains only on top of the stack 102 in the areas that are to be protected during the etch process and leaves the areas 118 exposed to an etching plasma. Those skilled in the art will understand that film stacks comprising different layers and/or layers of different thickness may be used to practice the present invention.

Figure 1C:
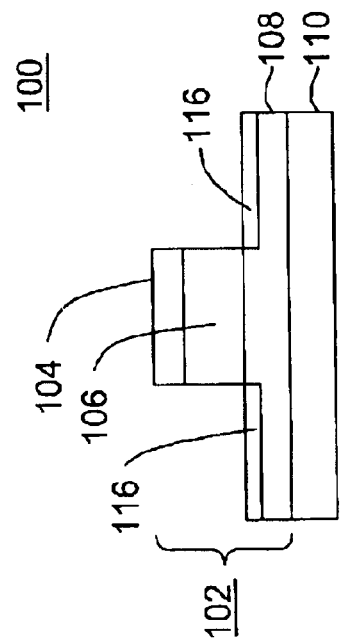
FIG. 1c depicts a schematic cross-sectional view of a gate structure comprising the polysilicon layer and hafnium-dioxide layer of FIG. 1a that has been etched using a chemistry comprising nitrogen according to an example of the present invention.
Figure 1B:
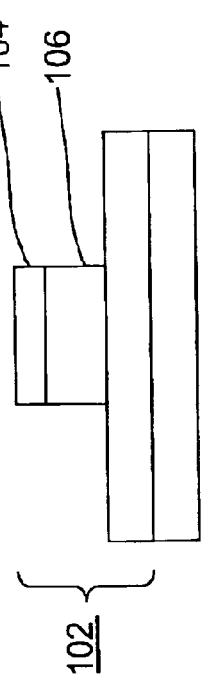
FIG. 1b depicts a schematic cross-sectional view of a gate structure comprising the polysilicon layer and hafnium-dioxide layer of FIG. 1a that has been etched using an oxygen-free chemistry according to an example of the present invention.

FIG. 1b is a schematic cross-sectional view of a gate structure of FIG. 1a that has been etched using an oxygen-free etching chemistry (e.g., $HBr/Cl_2$ chemistry) according to an example of the present invention. After plasma etch is completed, the silicon substrate 110 is free from silicon dioxide formation. Similar results can be achieved using either a single-step etch process of method 200 depicted in FIG. 2 as described below or a two-step etch process of method 240 depicted in FIG. 4 as described below.

FIG. 1c is a schematic cross-sectional view of the gate structure of FIG. 1a that has been etched using the oxygen-free etching chemistry (e.g., $HBr/Cl_2$ chemistry) further comprising nitrogen according to an example of the present invention. After plasma etching is completed, the silicon substrate 110 is free from silicon dioxide formation and the oxygen permeable dielectric layer 108 has been passivated in regions 116 by the formation of a nitride of the dielectric material (e.g., $HfO_2$ is nitrided to form $HfO_2N$). The passivation protects the underlying silicon substrate 110 from diffusion of oxygen during any post-etch processes or exposure to air. Similar results can be achieved using either a single-step etch process of method 220 depicted in FIG. 3 as described below or using a two-step etch process of method 250 depicted in FIG. 5 as described below. In the two-step etch process, nitrogen can be added during either the main etch or overetch step.

Figure 3:
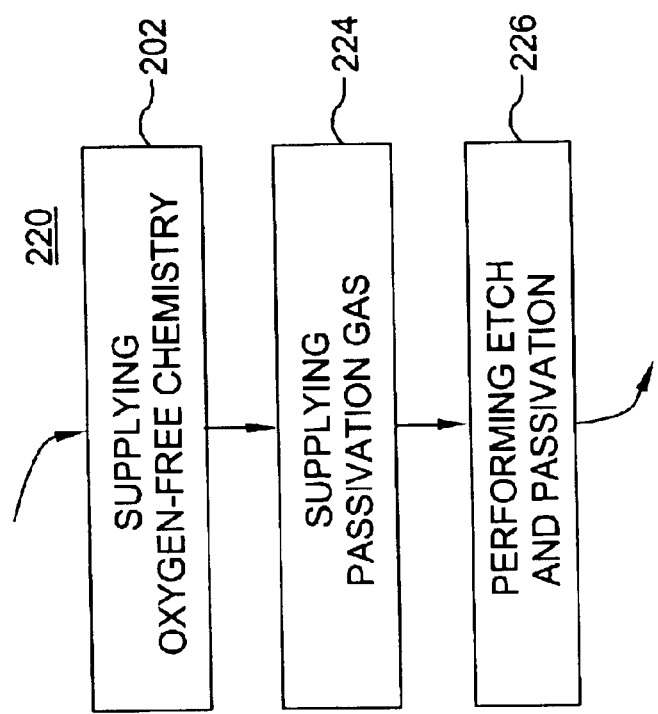
FIGS. 2 and 3 depict flow diagrams of examples of the inventive method using a single-step etch process.
Figure 2:
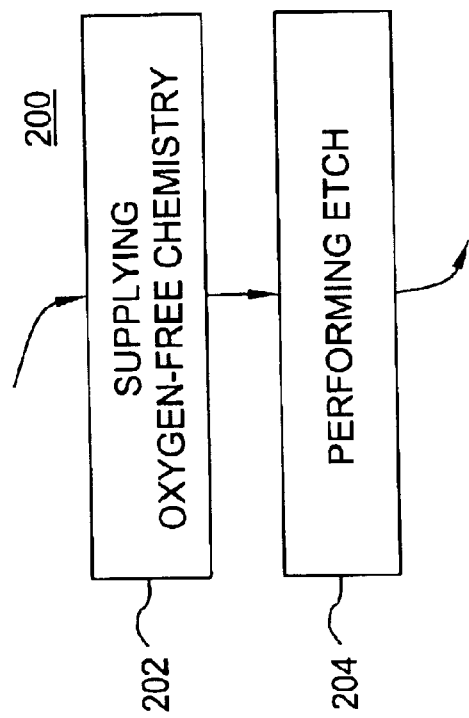

FIGS. 2 and 3 are flow diagrams of examples of the inventive method for plasma etching a polysilicon electrode of the gate structure 102 using a single-step etch process.

In FIG. 2, a method 200 comprises supplying an oxygen-free chemistry (step 202) having a ration of HBr to $Cl_2$ ($HBr:Cl_2$) of between 10:1 and 1:10. More specifically, the method provides the chemistry at a flow rate of 20–300 sccm HBr and 20–200 sccm $Cl_2$, and performing etch of the polysilicon layer (step 204) by applying power to an inductively coupled antenna between 200 to 3000 Watts, applying a cathode electrode bias power between 0 to 300 Watts, and maintaining a wafer temperature between 100 to 500 degrees Celsius and a pressure in the reactor between 2 to 100 mTorr.

In FIG. 3, a method 220 comprises supplying an oxygen-free chemistry (step 202) at a flow rate of 20–300 sccm HBr and 20–200 sccm $Cl_2$, supplying nitrogen (step 224) at a flow rate of 2–100 sccm, and simultaneously performing etch and passivation of the polysilicon layer (step 226) by applying power to an inductively coupled antenna between 200 to 3000 Watts, applying a cathode electrode bias power between 0 to 300 Watts, and maintaining a wafer temperature between 100 to 500 degrees Celsius and a pressure in the reactor between 2 to 100 mTorr. The flow rate of the passivation gas is generally between 1 and 50 percent of the total flow of the oxygen-free chemistry gases. The passivation gas may be supplied during the etch process or after the etch process. The passivation gas passivates the dielectric layer as discussed above.

Figure 5:
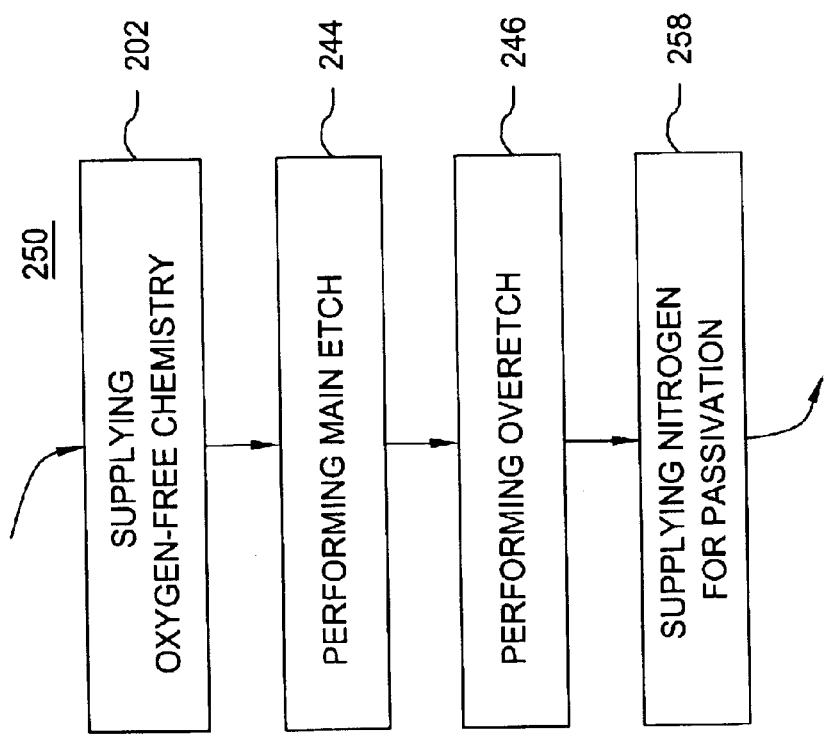
FIGS. 4 and 5 depict flow diagrams of examples of the inventive method using a two-step etch process.
Figure 4:
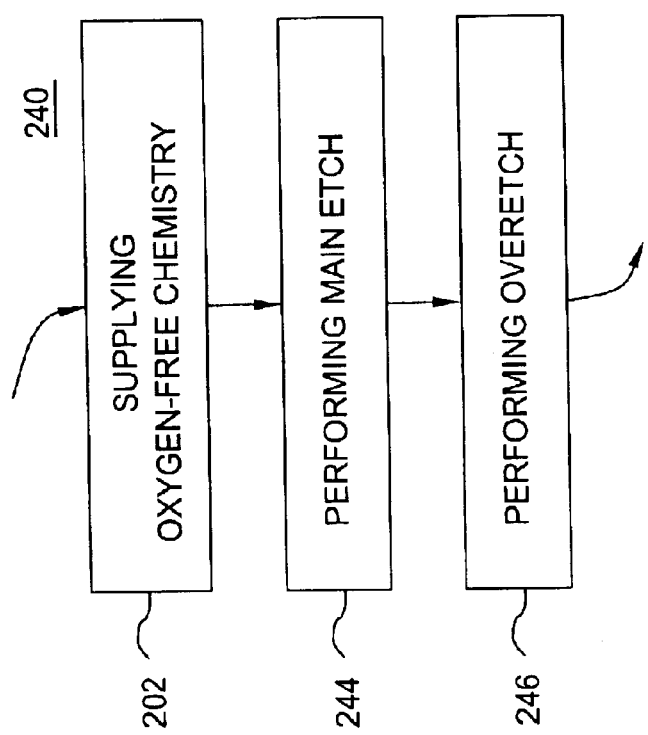

FIGS. 4 and 5 are flow diagrams of examples of the inventive method for plasma etching a polysilicon electrode of the gate structure 102 using a two-step etch process.

In FIG. 4, a method 240 comprises supplying an oxygen-free chemistry (step 202) at a flow rate of 20–300 sccm HBr and 20–200 sccm $Cl_2$, performing main etch (step 244), and performing overetch (step 246). Steps 244 and 246 are performed by applying power to an inductively coupled antenna between 200 to 3000 Watts, applying a cathode electrode bias power between 0 to 300 Watts, and maintaining a wafer temperature between 100 to 500 degrees Celsius and a pressure in the reactor between 2 to 100 mTorr. Because both the main etch and overetch processes are performed without oxygen, no silicon dioxide is formed in the silicon substrate.

In FIG. 5, a method 250 comprises supplying an oxygen-free chemistry (step 202) at a flow rate of 20–300 sccm HBr and 20–200 sccm $Cl_2$, performing main etch (step 244), performing, overetch (step 246), and supplying nitrogen for passivating the dielectric layer (step 258) at a flow rate of 2–100 sccm. Steps 244, 246, and 258 are performed by applying power to an inductively coupled antenna between 200 to 3000 Watts, applying a cathode electrode bias power between 0 to 300 Watts, and maintaining a wafer temperature between 100 to 500 degrees Celsius and a pressure in the reactor between 2 to 100 mTorr. After polysilicon is removed in step 246, the substrate is exposed to a nitrogen plasma in step 258. The passivation gas may be included in the main and overetch steps, in the overetch step, or after the overetch step.

The nitrogen plasma may be applied either in-situ or in a separate plasma reactor that is adapted to the nitrogen based chemistries. A user can make can a decision of which process to use. The decision making routine may be automated or the selection may be made before the process commences.

A wafer or other form of workpiece 100 is etched in one embodiment, for example, in a DPS reactor, by practicing the method 250. Specifically, the polysilicon layer 106 is etched by applying power to an inductively coupled antenna between 200 to 3000 Watts, applying a cathode electrode (or wafer pedestal) bias power between 0 to 300 Watts, while maintaining a wafer temperature between 100 to 500 degrees. Celsius and a pressure in the reactor between 2 to 100 mTorr. The oxygen-free chemistry and nitrogen are supplied at a flow rate in the range of 20–300 sccm HBr, 20–200 sccm $Cl_2$, and 2–100 sccm $N_2$.

FIG. 7 is a table 700 summarizing the etch process parameters through which one can practice the invention using a DPS Centura® system. The parameters for embodiments of single-step and two-step etch processes presented above are summarized in columns 702 and 704, respectively. It should be understood, however, that the use of a different chamber may necessitate different process parameter values and ranges. Those skilled in the art will understand that other forms of plasma etch reactors may be used to practice the invention, including chambers with remote plasma sources, microwave plasma chambers, electron cyclotron resonance (ECR) plasma chambers, and the like.

Although the forgoing discussion referred to the gate structure and stack comprising a hafnium-dioxide layer, fabrication of the other structures and features used in the intergrated circuits and devices can benefit from the invention. The invention can be practiced in other etch systems wherein the processing parameters may be adjusted to achieve acceptable characteristics by those skilled in the art by utilizing the teachings disclosed herein without departing from the spirit of the invention.

While the foregoing is directed to an illustrative embodiment of the present invention, other and further embodiments of the invention may be devised without departing from the basic scope thereof, and the scope thereof is determined by the claims that follow.

What is claimed is:

1. A method for fabricating a gate structure having a polysilicon electrode and an oxygen permeable dielectric layer deposited on a semiconductor substrate, comprising:
   etching a defined portion of a polysilicon layer in a plasma comprising an oxygen-free chemistry until all of the defined portion is removed; and
   nitriding the oxygen permeable dielectric layer.

2. The method of claim 1 wherein the oxygen permeable dielectric layer comprises at least one of $HfO_2$, $ZrO_2$, $Al_2O_3$, BST, PZT, $ZrSiO_2$, $HSiO_2$ and $TaO_2$.

3. The method of claim 1 wherein the oxygen permeable dielectric layer is $HfO_2$.

4. The method of claim 1 wherein the oxygen-free chemistry comprises HBr and $Cl_2$.

5. The method of claim 1, wherein the nitriding step further comprises:
   exposing said semiconductor substrate to a plasma comprising nitrogen.

6. The method of claim 5 wherein the nitriding step is performed during the etching step.

7. The method of claim 5 wherein the nitriding step is performed after the etching step.

8. The method of claim 5 wherein the nitriding step further comprises the step of supplying 2 to 100 sccm of $N_2$.

9. The method of claim 5 wherein the nitriding step further comprises the step of maintaining a pressure of between 2–100 m Torr.

10. The method of claim 1 wherein the nitriding step is performed in a separate reactor from a reactor used to perform the etching step.

11. A method for fabricating a gate structure having a polysilicon electrode and an oxygen permeable dielectric layer deposited on a semiconductor substrate, comprising:
   performing a main etch of a polysilicon layer in a plasma comprising an oxygen-free gas chemistry;
   performing an overetch of the polysilicon layer in a plasma comprising an oxygen-free gas chemistry; and
   nitriding the oxygen permeable dielectric layer.

12. The method of claim 11 wherein the oxygen permeable dielectric layer comprises at least one of $HfO_2$, $ZrO_2$, $Al_2O_3$, BST, PZT, $ZrSiO_2$, $HfSiO_2$ and $TaO_2$.

13. The method of claim 11 wherein the oxygen permeable dielectric layer is $HfO_2$.

14. The method of claim 11 wherein the oxygen-free chemistry comprises HBr and $Cl_2$.

15. The method of claim 11 wherein the nitriding step further comprises:
   exposing said semiconductor substrate to a plasma comprising nitrogen.

16. The method of claim 15 wherein the exposing nitriding step is performed during the main etch and overetch step.

17. The method of claim 15 wherein the nitriding step is performed during the overetch step.

18. The method of claim 15 wherein the nitriding step is performed after the overetch step.

19. The method of claim 15 wherein the nitriding step further comprises:
   supplying 2 to 100 sccm of $N_2$.

20. The method of claim 15 wherein the nitriding step further comprises:
   a pressure of between 2–100 mTorr.

21. The method of claim 17 wherein the nitriding step is performed in a separate reactor from a reactor used to perform the etching step.

22. A computer-readable medium containing software that when executed by a computer causes an etch reactor to plasma etch a gate structure having a polysilicon electrode and an oxygen permeable dielectric layer deposited on a semiconductor substrate using a method comprising:
   etching a defined portion of a polysililcon layer in a plasma comprising an oxygen-free gas chemistry until all of the defined portion is removed; and
   nitriding the oxygen permeable dielectric layer.

23. The method of claim 22 wherein the oxygen permeable dielectric layer comprises at least one of $HfO_2$, $ZrO_2$, $Al_2O_3$, BST, PZT, $ZrSiO_2$, $HfSiO_2$ and $TaO_2$.

24. The method of claim 22 wherein the oxygen permeable dielectric layer is $HfO_2$.

25. The method of claim 22 wherein the oxygen-free chemistry comprises HBr and $Cl_2$.

26. The method of claim 22 wherein the nitriding step further comprises:
   exposing said semiconductor substrate to a plasma comprising nitrogen.

27. The method of claim 26 wherein the nitriding step is performed during the etching step.

28. The method of claim 26 wherein the nitriding step is performed after the etching step.

29. The method of claim 26 wherein the nitriding step further comprises the step of:
   supplying 2 to 100 sccm of $N_2$.

30. The method of claim 26 wherein the nitriding step further comprises the step of:
   maintaining a pressure of between 2–100 mTorr.

31. The method of claim 28 wherein the nitriding step is performed in a separate reaction from a reactor used to perform the etching step.

32. A computer-readable medium containing software that when executed by a computer causes an etch reactor to plasma etch a gate structure having a polysilicon electrode and an oxygen permeable dielectric layer deposited on a semiconductor substrate using a method comprising:
   performing a main etch of a polysilicon layer in a plasma comprising an oxygen-free gas chemistry;
   performing an overetch of the polysilicon layer in a plasma comprising an oxygen-free gas chemistry; and
   nitriding the oxygen permeable dielectric layer.

33. The method of claim 32 wherein the oxygen permeable dielectric layer comprises at least one of $HfO_2$, $ZrO_2$, $Al_2O_3$, BST, PZT, $ZrSiO_2$, $HfSiO_2$ and $TaO_2$.

34. The method of claim 32 wherein the oxygen permeable dielectric layer is $HfO_2$.

35. The method of claim 32 wherein the oxygen-free chemistry comprises HBr and $Cl_2$.

36. The method of claim 32 wherein the nitriding step further comprises:
   exposing said semiconductor substrate to a plasma comprising nitrogen.

37. The method of claim 36 wherein the nitriding step is performed during the main etch and overetch step.

38. The method of claim 36 wherein the nitriding step is performed during the overetch step.

39. The method of claim 36 wherein the nitriding step is performed after the overetch step.

40. The method of claim 36 wherein the nitriding step further comprises the step of:

supplying 2 to 100 sccm of $N_2$.

41. The method of claim 36 wherein the nitriding step further comprises the step of:

maintaining a pressure of between 2–100 mTorr.

42. The method of claim 32, wherein the nitriding step is performed in a separate reactor from a reactor used to perform the etch step.

43. The method of claim 32, wherein the nitriding step is performed in a reactor performing the etch step.

44. The method of claim 3, wherein the nitriding step forms $HfO_2N$ on the $HfO_2$ layer.

45. The method of claim 1, wherein the nitriding step further comprises:

exposing said semiconductor substrate to a plasma comprising nitrogen and an inert gas.

46. The method of claim 45, wherein the inert gas is He.

47. The method of claim 1, wherein the nitriding step is performed in a reactor performing the etch step.

48. The method of claim 13, wherein the nitriding step forms $HfO_2N$ on the $HfO_2$ layer.

49. The method of claim 11, wherein the nitriding step further comprises:

exposing said semiconductor substrate to a plasma comprising nitrogen and an inert gas.

50. The method of claim 49, wherein the inert gas is He.

51. The method of claim 11, wherein the nitriding step is performed in a reactor performing the etch step.

* * * * *